United States Patent
Kuo et al.

(10) Patent No.: US 7,394,161 B2
(45) Date of Patent: Jul. 1, 2008

(54) CHIP STRUCTURE WITH PADS HAVING BUMPS OR WIREBONDED WIRES FORMED THEREOVER OR USED TO BE TESTED THERETO

(75) Inventors: Nick Kuo, Hsinchu (TW); Chiu-Ming Chou, Kaohsiung (TW); Chien-Kang Chou, Tainan Hsien (TW); Chu-Fu Lin, Kaohsiung (TW)

(73) Assignee: MEGICA Corporation, Hsinchu (TW)

( * ) Notice: Subject to any disclaimer, the term of this patent is extended or adjusted under 35 U.S.C. 154(b) by 149 days.

(21) Appl. No.: 10/730,834

(22) Filed: Dec. 8, 2003

(65) Prior Publication Data

US 2005/0121804 A1 Jun. 9, 2005

(51) Int. Cl.
*H01L 23/43* (2006.01)

(52) U.S. Cl. .................. 257/780; 257/784; 257/786

(58) Field of Classification Search ............ None
See application file for complete search history.

(56) References Cited

U.S. PATENT DOCUMENTS

| | | | | |
|---|---|---|---|---|
| 4,051,508 A | * | 9/1977 | Sato et al. | 257/737 |
| 5,646,439 A | * | 7/1997 | Kitayama et al. | 257/632 |
| 5,854,513 A | * | 12/1998 | Kim | 257/737 |
| 6,511,901 B1 | * | 1/2003 | Lam et al. | 438/612 |
| 6,590,295 B1 | * | 7/2003 | Liao et al. | 257/781 |
| 6,844,631 B2 | * | 1/2005 | Yong et al. | 257/786 |
| 6,864,562 B1 | * | 3/2005 | Toyosawa et al. | 257/637 |
| 2003/0197289 A1 | * | 10/2003 | Lin | 257/786 |
| 2004/0036170 A1 | * | 2/2004 | Lee et al. | 257/734 |

OTHER PUBLICATIONS

Harper, Electronic Packaging Interconnection Handbook,1991, McGraw-Hill, 5.1-5.22.*

* cited by examiner

*Primary Examiner*—Leonardo Andujar
(74) *Attorney, Agent, or Firm*—Winston Hsu

(57) ABSTRACT

A chip structure comprising a semiconductor substrate, a plurality of dielectric layers, a plurality of circuit layers, a passivation layer, a metal layer and at least a bump. The semiconductor substrate has a plurality of electronic devices positioned on a surface layer of the semiconductor substrate. The dielectric layers are sequentially stacked on the semiconductor substrate and have a plurality of via holes. The circuit layers are disposed on one of the dielectric layers, wherein the circuit layers are electrically connected with each other through the via holes and are electrically connected to the electronic devices. The passivation layer is disposed over the circuit layers and the dielectric layers, wherein the passivation layer comprises an opening that exposes one of the metal layers. The metal layer is disposed over the passivation layer, wherein the metal layer comprises at least a bump pad and at least a testing pad, the bump pad electrically connecting with the testing pad. The bump is disposed on the bump pad.

43 Claims, 9 Drawing Sheets

CHIP STRUCTURE WITH PADS HAVING BUMPS OR WIREBONDED WIRES FORMED THEREOVER OR USED TO BE TESTED THERETO

BACKGROUND OF THE INVENTION

1. Field of the Invention

The invention relates to a chip structure with bumps and testing pads. More particularly, the invention relates to a chip structure, wherein the bumps will not be traumatized by testing probes during testing because the testing probes do not poke the bump. In stead, it contacts the testing pads for testing the chip structure.

2. Description of the Related Art

Information products are playing important roles in today's competitive society. With the evolution of the information products and the introduction of the concept of integrating various circuit designs, the latest single chip, generally, provides more functions than the former one. After integration, the dimension of the circuits is reduced and the majority of the signals are being transmitted within a single chip. As a result, paths for transmitting signals are reduced and the performance of the chip is improved.

Moreover, in the flip-chip technology, multiple bumps can be formed on the chip for connecting the chip to a substrate. Because the bumps can be formed on all area of the active surface of the chip, the chip can provide more layouts to connect with external circuitry than those suited only for a wire-bonding process. Compared to the connection of merely using a wire-bonding process to electrically connect a chip with a substrate, the connection of using bumps to electrically connect a chip with a substrate is advantageous in that it transmits signals in a shorter and wider path. Therefore, the electrical performance of the package using a flip-chip technology is considered a high-quality one.

After the bumps are formed on the chip, a testing step proceeds. Testing probes are used to contact the bumps and then the chip can be tested. Moreover, the testing probes generally contact the bumps repeatedly during the testing step. As a result, the bumps are subjected to be traumatized by the testing probes. In a serious consequence, some damaged bumps will not provide the reliable bond between the chip and the substrate, often calling in extra work of reworking, if the problem is still revocable.

SUMMARY OF THE INVENTION

Therefore, one objective of the present invention is to provide a chip structure with bumps and testing pads, wherein the bumps are not damaged or traumatized by the testing probes during testing because the testing probes contact the alternative testing pads for testing purposes.

In order to reach the above objectives, the present invention provides a chip structure comprising a semiconductor substrate, a plurality of dielectric layers, a plurality of circuit layers, a passivation layer, a metal layer and at least a bump. The semiconductor substrate has a plurality of electronic devices positioned on a surface layer of the semiconductor substrate. The dielectric layers are sequentially stacked on the semiconductor substrate and have a plurality of via holes. The circuit layers are disposed on one of the dielectric layers, wherein the circuit layers are electrically connected with each other through the via holes and are electrically connected to the electronic devices. The passivation layer is disposed over the circuit layers and over the dielectric layers, wherein the passivation layer comprises at least an opening that exposes one of the top metal layers of IC circuitry. The metal layer is disposed over the passivation layer, wherein the metal layer comprises at least a bump pad and at least a testing pad, the bump pad electrically connects to the testing pad. The bump is disposed on the bump pad.

In an embodiment of the configuration of the metal layer, the metal layer is a composite structure comprising an adhesion/barrier layer and a thick gold layer, the thick gold layer formed on the adhesion/barrier layer, wherein the material constituting the adhesion/barrier layer is selected from a group consisting of chromium, titanium, a titanium-tungsten alloy, titanium-nitride, tantalum nitride and tantalum.

In the other embodiment, the metal layer is a composite structure comprising an adhesion/barrier layer and a copper layer, the copper layer formed on the adhesion/barrier layer, wherein the material constituting the adhesion/barrier layer comprises chromium, titanium, tantalum, titanium-tungsten alloy, titanium nitride or tantalum nitride. Also, the metal layer further comprises a nickel layer and a gold layer, wherein the nickel layer is formed on the copper layer and the gold layer is formed on the nickel layer.

As to the dimension of the metal layer, it has a thickness preferably larger than about 0.4 µm and has a width preferably larger than 0.1 µm. The dimension of the metal layer over the passivation layer is preferably larger than that of the circuit layer under the passivation layer.

Optionally, the chip structure comprises a polymer layer disposed between the metal layer and the passivation layer. The polymer layer can be made of polyimide, benzocyclobutene, porous dielectric material, parylene, epoxy, solder mask material or elastomer. Moreover, the chip structure selectively comprises at least an additional metal layer disposed between the metal layer and the passivation layer. The chip structure with a multiple-metal-layer scheme over the passivation layer is provided.

In an embodiments, the metal layer comprises at least a metal line connecting the bump pad to the testing pad. In the other embodiment, one of the circuit layers under the passivation layer comprise a metal line and the bump pad is electrically connected with the testing pad through the metal line.

The opening of the passivation layer has a width preferably larger than about 0.1 um and has a thickness preferably larger than about 0.35 µm. The passivation layer is a silicon-oxide layer, a silicon-nitride layer, a phosphosilicate glass (PSG) layer, a silicon-oxide-nitride layer or a composite structure comprising the above-mentioned layers.

The bump comprises a solder metal and an under-bump-metallurgy layer, wherein the under-bump-metallurgy layer is disposed on the bump pad and the solder metal is disposed on the under-bump-metallurgy layer. The under-bump metallurgy layer is formed, for example, by a titanium layer, a copper layer and a nickel layer, from the bottom to the top. The material constituting the solder metal is selected from a group consisting of a tin-lead alloy and a lead-free alloy.

There is another usage of the testing pad. When the testing process is no longer needed, it can be bonded to the wire-bonding wire. Alternatively, the metal layer further comprises a wire-bonding pad electrically connecting with the testing pad and the bump pad, and the wire-bonding pad is connected with a conductive wire during a wire-bonding step.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

FIG. 2 series differ themselves from FIG. 1 series by the utilization of the testing pad. Unlike FIG. 1 series, FIG. 2 series do not use the testing pad for wire-boding purposes. In stead, a dedicated wire-bonding pad is used for this purpose.

DESCRIPTION OF THE PREFERRED EMBODIMENTS

First Embodiment

Figure 1A:
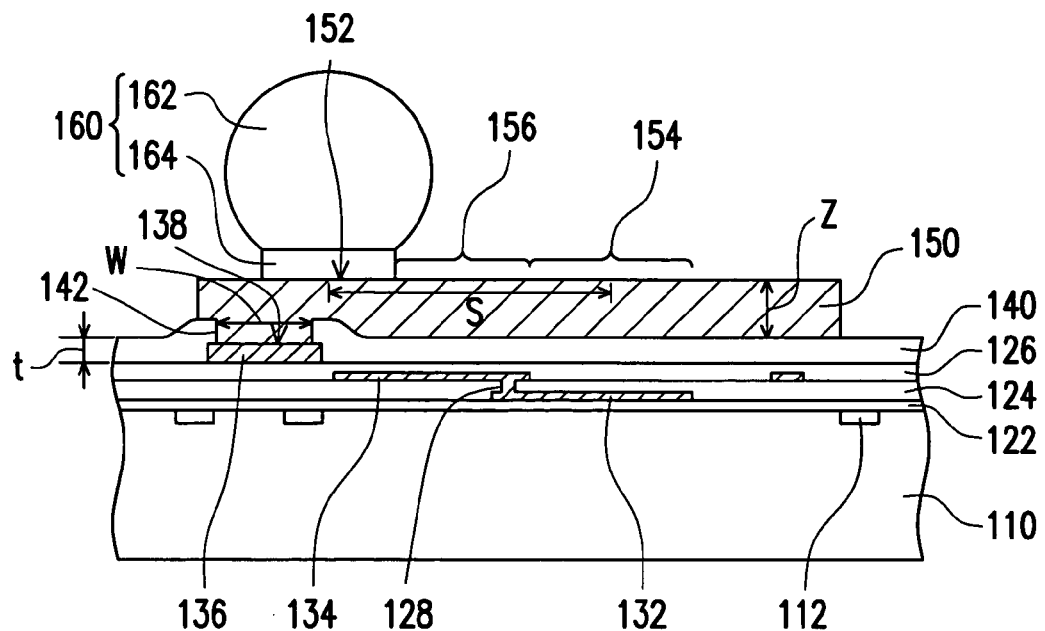
FIGS. 1A-1F are schematic cross-sectional views showing chip structures having a bump and a testing pad according to a first embodiment of the present invention.

FIGS. 1A-1F are schematic cross-sectional views showing chip structures having a bump and a testing pad according to a first embodiment of the present invention. Referring to FIG. 1A-1F, in a semiconductor fab, multiple electronic devices 112, such as transistors or MOS devices, are formed on a surface of a semiconductor substrate 110, wherein the semiconductor substrate 110 is, for example, silicon.

A fine-line interconnection scheme is formed over the semiconductor substrate 110. The semiconductor substrate 110 includes multiple dielectric layers 122, 124 and 126 and multiple circuit layers 132, 134 and 136. The dielectric layers 122, 124 and 126 are stacked on the semiconductor substrate 110 and have a plurality of via holes 128 (only shown one of them). The circuit layers 132, 134, and 136 are disposed on the dielectric layers 122, 124, and 126, respectively, and the circuit layer 136 has a contact 138. The circuit layers 132, 134, and 136 are electrically connected with each other through the via holes 128 and are electrically connected to the electronic devices 112. The circuit layers 132, 134, and 136 are formed, for example, by depositing aluminum or an aluminum alloy using a PVD process or by depositing copper or a copper alloy using electroplating processes and damascene processes.

A passivation layer 140 is formed over the fine-line interconnection scheme including the dielectric layers 122, 124 and 126 and the circuit layers 132, 134 and 136. The passivation layer 140 has a thickness t, for example, larger than 0.35 μm. It should be noted that the passivation layer 150 should have enough thickness to prevent moisture, impurities, mobile ions or transitional metal elements from penetrating therethrough. The passivation layer 140 can be a silicon-dioxide layer, a silicon-nitride layer, a phosphosilicate glass (PSG) layer, a silicon-oxynitride layer or a composite structure comprising the above-mentioned layers. The passivation layer 140 has an opening 142 exposing the contact 138. The opening 142 has a width larger than about 0.1 μm.

Figure 1B:
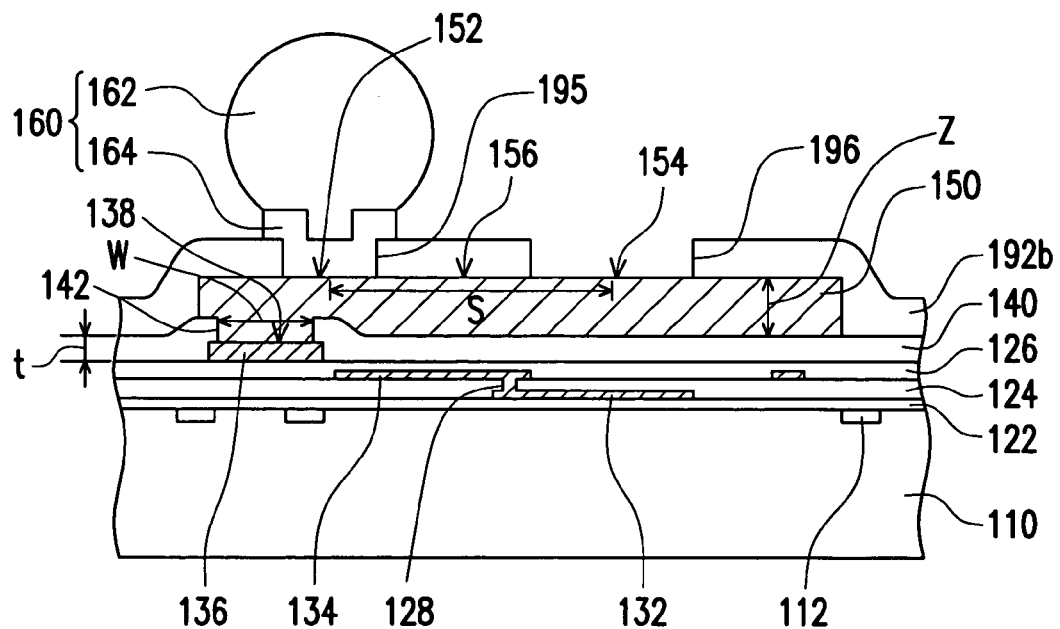
Figure 1C:
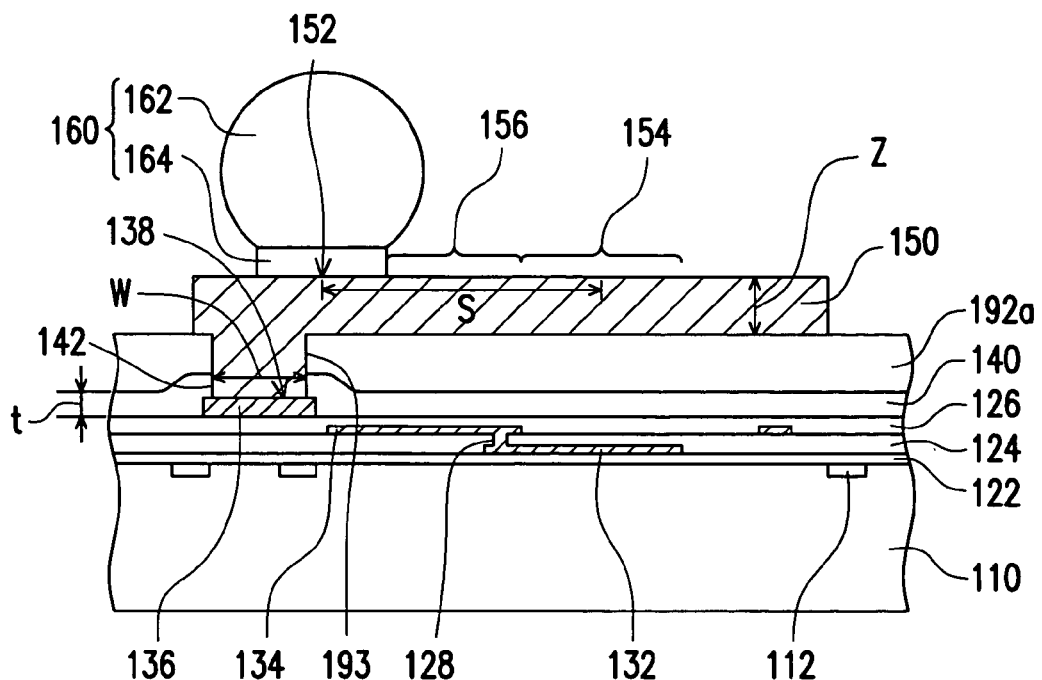
Figure 1D:
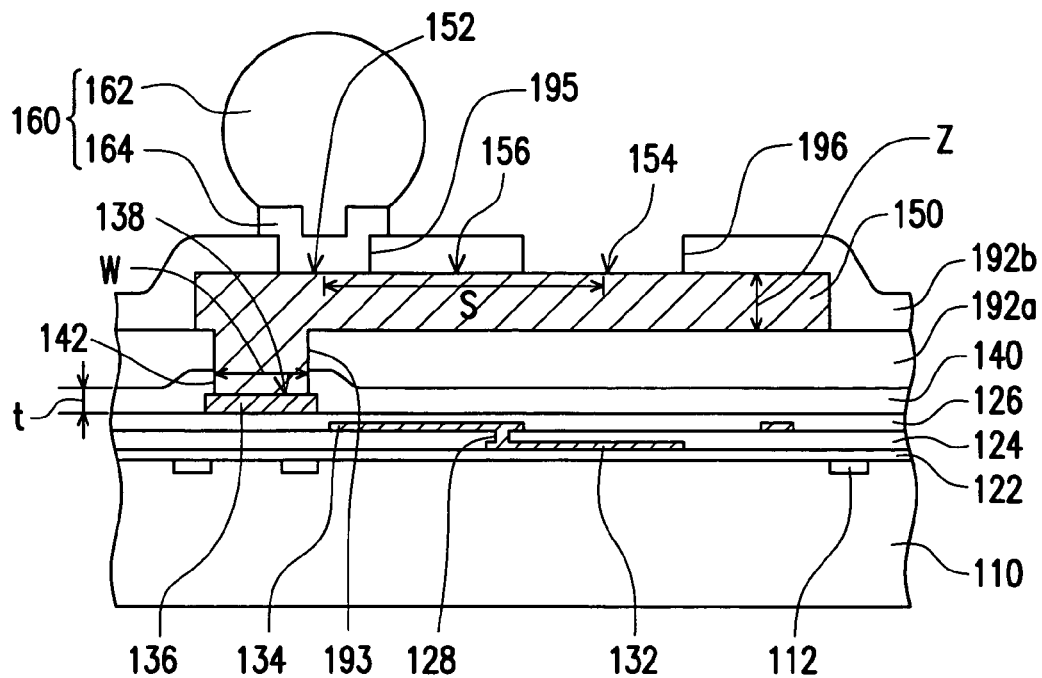
Figure 1E:
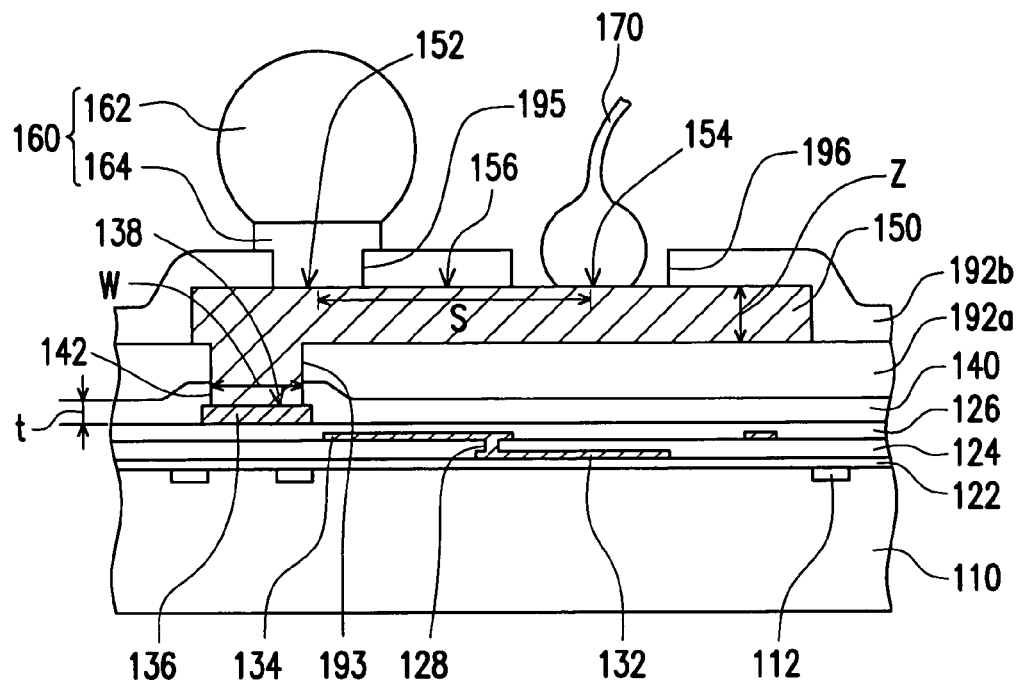

The following description is referred to a post-passivation scheme formed over the passivation layer 140 and having a single metal layer 150, shown in FIGS. 1A-1E. The metal layer 150 is formed over the passivation layer 140 and electrically connects with the contact 138. The metal layer 150 has a thickness z preferably larger than about 0.6 μm and has a width preferably larger than 0.1 μm. In one case, the metal layer 150 is directly formed on the passivation layer 140, as shown in FIGS. 1A and 1B. In another case, the metal layer 150 is not formed on the passivation layer 140 directly. Rather, the post-passivation scheme further comprises a polymer layer 192a formed between the metal layer 150 and the passivation layer 140, as shown in FIGS. 1C, 1D and 1E. The polymer layer 192a has at least one via hole 193 through which the metal layer 150 is connected to the contact 138. The polymer layers 192a and 192b can be made of, for example, polyimide, benzocyclobutene, porous dielectric material, parylene, epoxy, solder mask material or elastomer. Besides, the post-passivation scheme may comprise a polymer layer 192b formed on the metal layer 150 for preventing the metal layer 150 from being damaged by the external force or malfunctioned due to the attack from the ambient (i.e. moisture, particles, and electrical static charges . . . etc.), as shown in FIGS. 1B, 1D and 1E. The polymer layer 192b has openings 195 and 196 exposing pads 152 and 154 of the metal layer 150. An alternative structure of such is provided as shown in FIGS. 1A and 1C, wherein the entire upper surface of the metal layer 150 is exposed.

Figure 4:
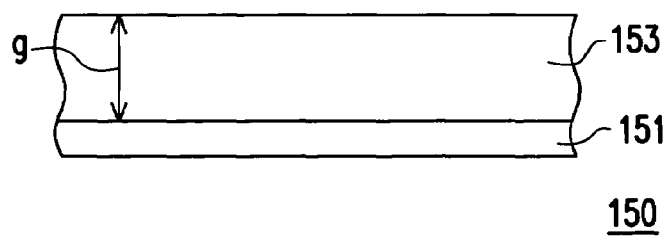
FIG. 4 is a schematic cross-sectional view showing a configuration of the metal layer 150.

In a case for the configuration of the metal layer 150 as shown in FIG. 4, the metal layer 150 is a composite structure comprising an adhesion/barrier layer 151 and a gold layer 153, wherein the adhesion/barrier layer 151 is a bottom layer and the gold layer 153 is formed on the adhesion/barrier layer 151. The gold layer 153 has a thickness g preferably larger than about 1 μm. The material constituting the adhesion/barrier layer 151 comprises, for example, chromium, titanium, tantalum, a titanium-tungsten alloy tantalum-nitride or titanium-nitride.

In the other case for the configuration of the metal layer 150, the metal layer 150 is a composite structure comprising an adhesion/barrier layer and a copper layer, wherein the adhesion/barrier layer is a bottom layer and the copper layer is formed on the adhesion/barrier layer. The material constituting the adhesion/barrier layer comprises, for example, chromium, titanium, tantalum, titanium-tungsten alloy, titanium nitride or tantalum nitride. In the case, the metal layer 150 is formed, from the bottom to the top, from the adhesion/barrier layer and the copper layer.

Besides, the metal layer 150 can further comprise a nickel layer formed on the copper layer. In this case, the metal layer 150 is formed, from the bottom to the top, from the adhesion/barrier layer, the thick copper layer and the nickel layer. Moreover, the metal layer 150 can further comprise a gold layer formed on the nickel layer. In this case, the metal layer 150 is formed, from the bottom to the top, from the adhesion/barrier layer, the copper layer, the nickel layer, and the gold layer.

The metal layer 150 has at least a bump pad 152, at least a testing pad 154 and at least a metal line 156, wherein the metal line 156 connects the bump pad 152 to the testing pad 154. The distance s between the bump pad 152 and the testing pad 154 is smaller than 1 micron and preferably smaller than 300 microns. At least a bump 160 comprising a solder metal 162 and an under-bump-metallurgy (UBM) layer 164 can be formed on the bump pad 152. During testing, a testing probe (not shown) can contact the testing pad 154 for testing the chip structure 100 without contacting the bump 160. Therefore, the mishap that the solder metal 162 of the bump 160 is traumatized by the impetus of the testing probe can be avoided. Moreover, the testing pad 154 can be positioned at the area under which there is no electronic device 112 at the semiconductor substrate 110, thereby avoiding the electronic devices 112 from being damaged during testing.

The UBM layer 164 is directly formed on the bump pad 152 and the solder metal 162 is formed on the UBM layer 164. The UBM layer 164 is formed, from the bottom to the top, from, for example, a titanium layer, a copper layer and a nickel layer. The material constituting the solder metal 162 is a tin-lead alloy or a lead-free alloy.

After testing, a wire-bonding step can be performed to form at least a conductive wire 170 connecting the testing pad, as shown in FIG. 1E. Because the testing pad 154 is positioned at the area under which there is no electronic device 112 at the semiconductor substrate 110, electronic devices 112 will not be damaged during the wire-bonding step. When the metal layer 150 comprises a gold layer for connecting the gold conductive wire 170, the bonding between the conductive wire 170 and the testing pad 154 is desirable.

Figure 1F:
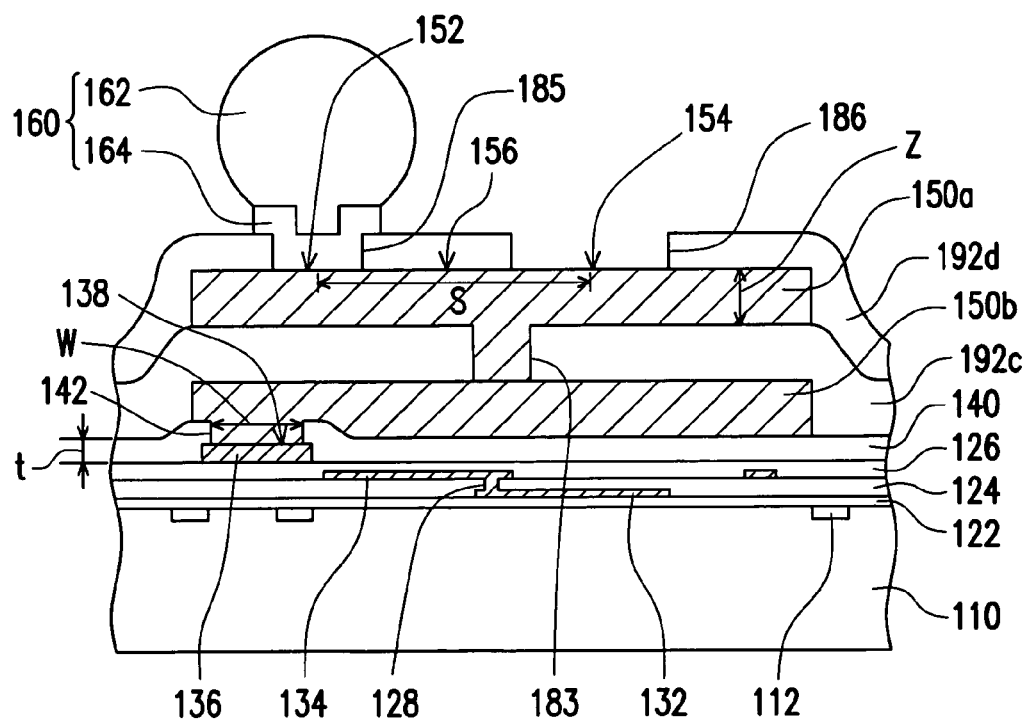

In another case, the post-passivation scheme has multiple metal layers and multiple polymer layers formed over the passivation layer. In FIG. 1F, over the passivation layer are, for example, two metal layers 150a and 150b. The invention is not limited to the above disclosure, but there can be three, four, or even more metal layers formed over the passivation layer. The metal layer 150b is disposed between the metal layer 150a and the passivation layer 140; the metal layer 150a is electrically connected to the contact 138 through the metal layer 150b. The metal layer 150b is directly formed on the passivation layer 140. There is a polymer layer 192c disposed between the metal layers 150a and 150b; the polymer layer 192c has at least a via hole 183 connecting the metal layers 150a and 150b. A polymer layer 192d is formed on the metal layer 150a for preventing the metal layer 150a from being intruded by moisture and from interference with electrical static charges in ambient. The polymer layer 192d has openings 185 and 186 exposing a bump pad 152 and a testing pad 154 of the met layer 150a, respectively. The polymer layers 192c and 192d can be made of, for example, polyimide, benzocyclobutene, porous dielectric material, parylene, epoxy, solder mask material or elastomer. The metal layers 150a and 150b could have the same configuration and material as the metal layer 150 disclosed in the above statement. The metal layer 150a has a metal line 156 connecting the testing pad 154 with the bump pad 152. The distance s between the bump pad 152 and the testing pad 154 is smaller than 1 micron and preferably smaller than 300 microns. At least a bump 160 is formed on the bump pad 152. Upon conducting electrical test, a testing probe (not shown) will touch the testing pad 154 for testing the chip structure 100. Optionally, after testing, a conductive wire (not shown) can be bonded onto connect with the testing pad 154. Wherever possible, the same reference numbers are used in the first embodiment to refer to the same or like parts.

Second Embodiment

The chip structure in accordance with the present invention is not limited to the first embodiment but can be configured as described in the second embodiment. FIGS. 2A-2E are schematic cross-sectional views showing chip structures having a bump and a testing pad according to a second embodiment of the present invention. The second embodiment differs itself from the first one by the way it utilizes the testing pad. In the second embodiment, the testing pad is NOT used for wireboding purpose. Thus it has a dedicated function to testing. Wherever possible, the same reference numbers are used in the second embodiment to refer to the same or like parts.

The following description is referred to the post-passivation scheme having a single metal layer 150, as shown in FIGS. 2A-2D. The metal layer 150 is formed over the passivation layer 140 and connected with the contact 138. The metal layer 150 has at least a bump pad 152, at least a testing pad 154, at least a wire-bonding pad 158, and metal lines 156 and 157, wherein the metal lines 156 and 157 connect the bump pad 152, the testing pad 154 and the wire-bonding pad 158. The distance s between the bump pad 152 and the testing pad 154 is smaller than 1 micron and preferably smaller than 300 microns. At least a bump 160 can be formed on the bump pad 152. A testing probe (not shown) will touch the testing pad 154 instead of the bump 160 for testing the chip structure 200. Therefore, the mishap that the solder metal 162 of the bump 160 and the wire-bonding pad 158 are traumatized by the impetus of the testing probe can be avoided. At least a conductive wire 170 can be formed on the wire-bonding pad 158 instead of the testing pad 154. The testing pad 154 and the wire-bonding pad 158 are positioned at the area under which there is no electronic device 112 at the semiconductor substrate 110, so the electronic devices 112 being damaged during the testing step and the wire-bonding step can be avoided.

Figure 2A:
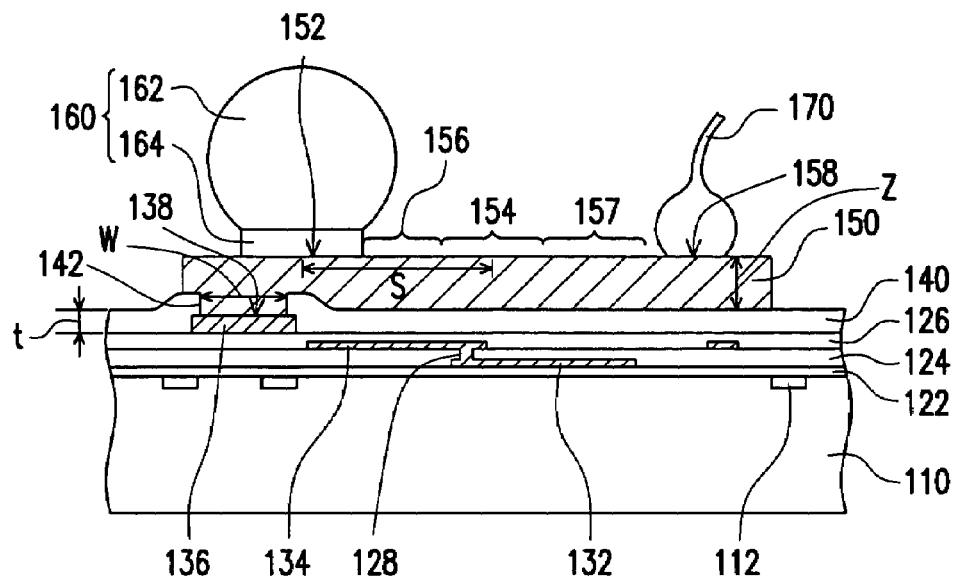
FIGS. 2A-2E are schematic cross-sectional views showing chip structures having a bump and a testing pad according to a second embodiment of the present invention.
Figure 2B:
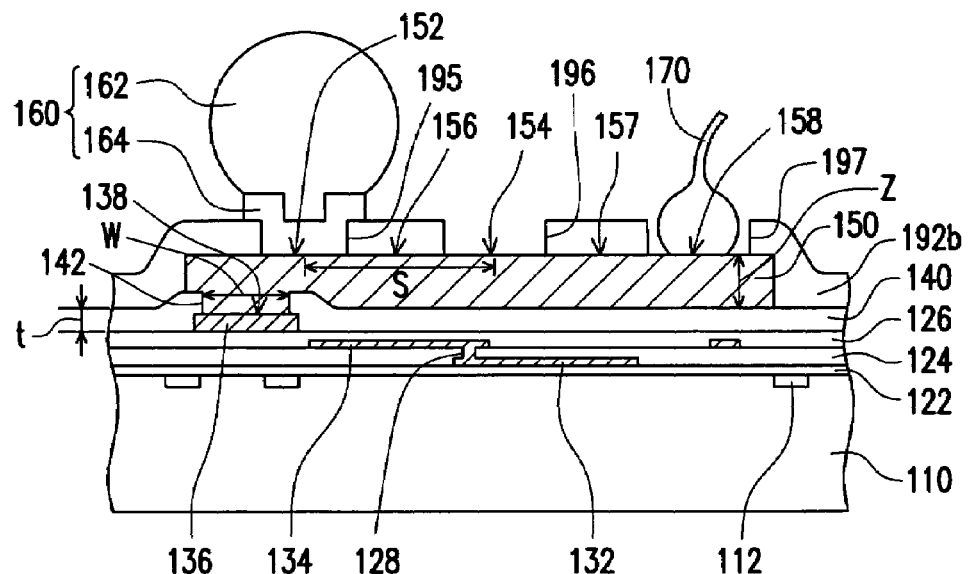
Figure 2C:
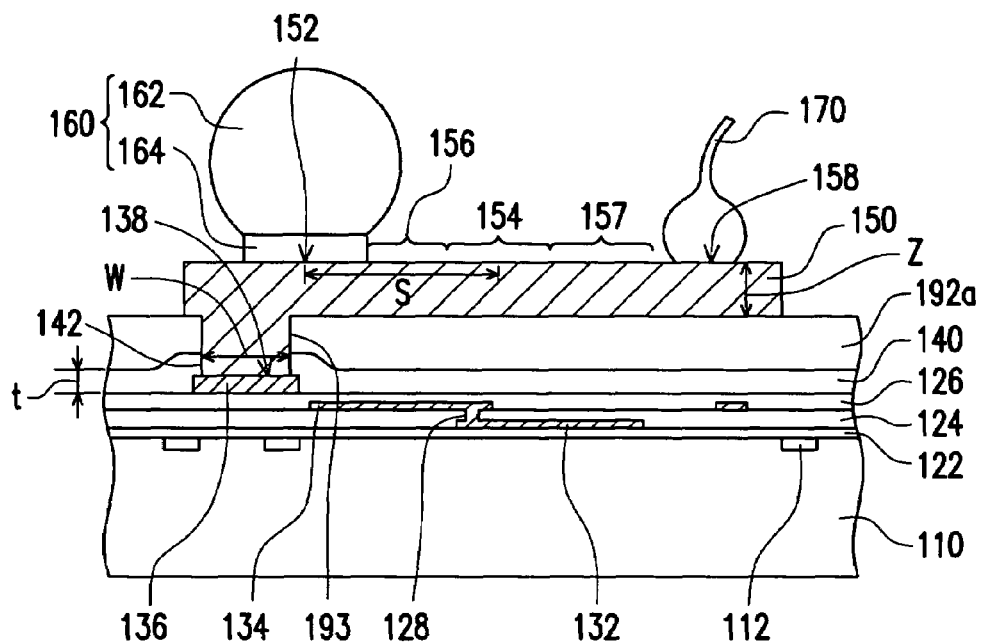
Figure 2D:
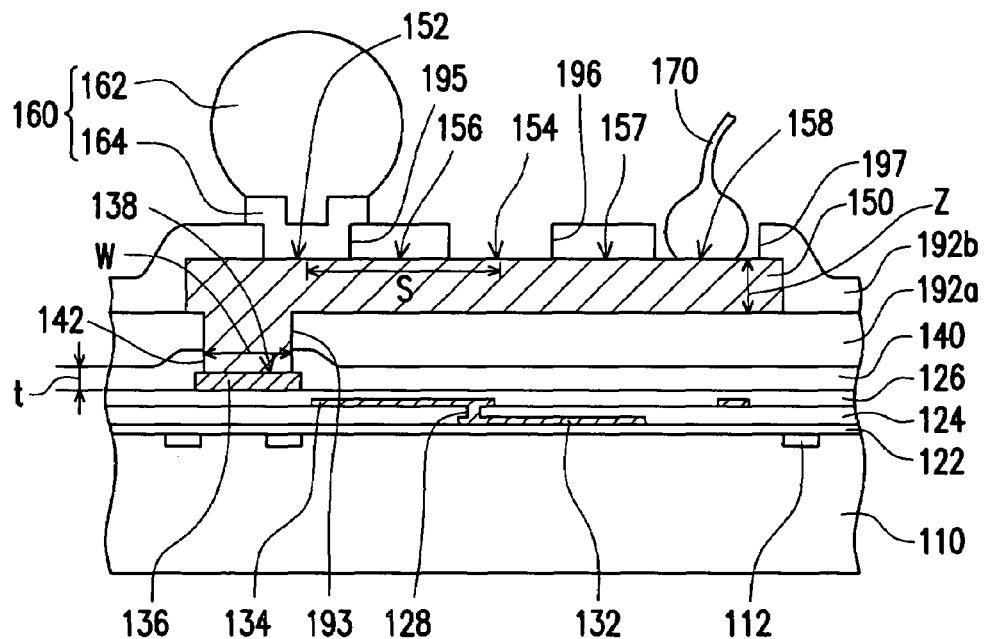

In a case, the metal layer 150 is directly formed on the passivation layer 140, as shown in FIGS. 2A and 2B. In another case, the metal layer 150 is not formed on the passivation layer 140 directly. The post-passivation scheme further comprises a polymer layer 192a formed between the metal layer 150 and the passivation layer 140, as shown in FIGS. 2C and 2D. The polymer layer 192a has at least one via hole 193 connecting the metal layer 150 to the contact 138. Besides, the post-passivation scheme may comprise a polymer layer 192b formed on the metal layer 150 for preventing the metal layer 150 from being damaged by an external force and from being affected by the environment (i.e. moisture, particles, and charges . . . etc.), as shown in FIGS. 2B and 2D. The polymer layer 192b has openings 195, 196 and 197 exposing the bump pad 152, the testing pad 154 and the wire-bonding pad 158, respectively. Alternatively, as shown in FIGS. 2A and 2C, the entire upper surface of the metal layer 150 is exposed. The polymer layers 192a, 192b can be made of, for example, polyimide, benzocyclobutene, porous dielectric material, parylene, epoxy, solder mask material or elastomer.

Figure 2E:
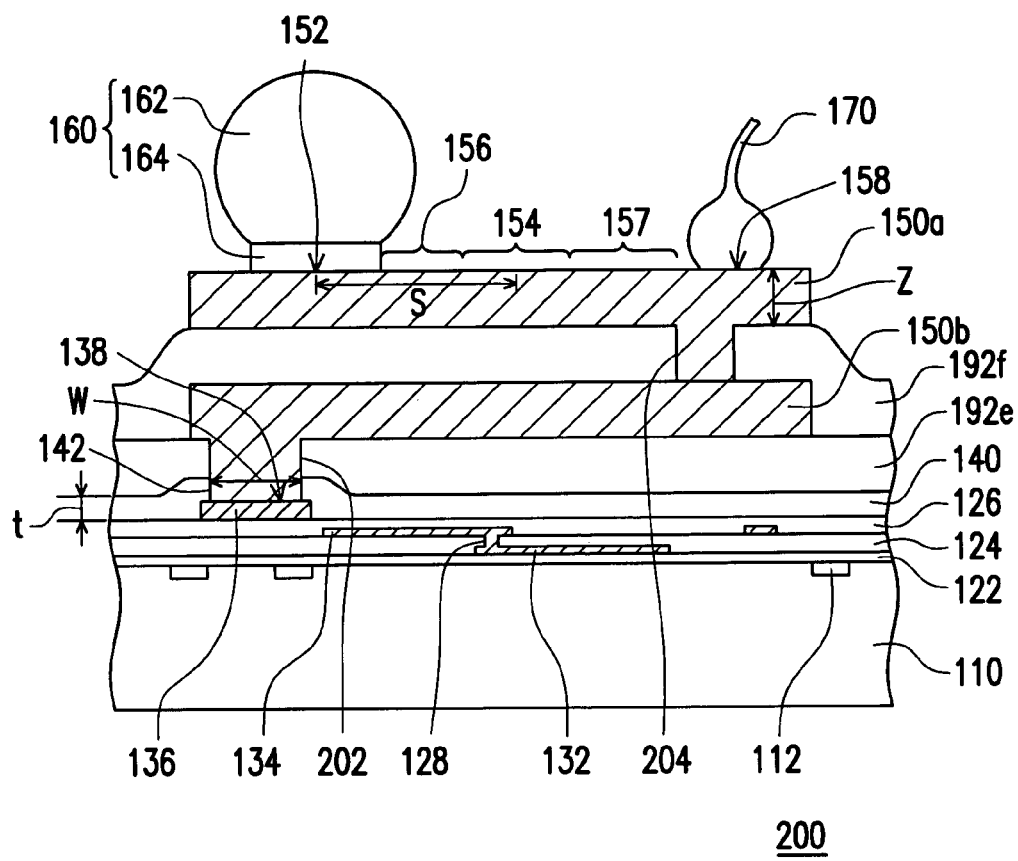

In another case, the post-passivation scheme may comprise multiple metal layers and multiple polymer layers formed over the passivation layer. In FIG. 2E, over the passivation layer 140 are, for example, two metal layers 150a and 150b. It should be noted that the gist of the invention is not limited to the number of metal layers depicted by the figure. There can be three, four, or even more metal layers formed over the passivation layer. The metal layer 150b is disposed between the metal layer 150a and the passivation layer 140; the metal layer 150a is electrically connected to the contact 138 through the metal layer 150b. A polymer layer 192e is formed between the metal layer 150b and the passivation layer 140. The polymer layer 192e has a via hole 202 through which the metal layer 150b is connected to the contact 138. A polymer layer 192f is formed between the metal layers 150a and 150b. The polymer layer 192f has a via hole 204 connecting the metal layers 150a and 150b. The upper surface of the metal layer 150a is exposed to the ambient. The metal layer 150a has a bump pad 152, a testing pad 154, a wire-bonding pad 158 and metal lines 156 and 157, wherein the metal lines 156 and 157 connect the testing pad 154, the wire-bonding pad 158 and the bump pad 152. The distance s between the bump pad 152 and the testing pad 154 is smaller than 1 micron and preferably smaller than 300 microns. At least a bump 160 is formed on the bump pad 152. A testing probe (not shown) will touch the testing pad 154 for testing the chip structure 200. A conductive wire 170 can be connected with the wire-bonding pad 158. The polymer layers 192e, 192f can be made of, for example, polyimide, benzocyclobutene, porous dielectric material, parylene, epoxy, solder mask material or elastomer.

Third Embodiment

In the above embodiments, the metal line connecting the bump pad with the testing pad is positioned over the passivation layer. The present invention is not limited to such positional arrangement. In this case, such metal line is disposed under the passivation layer. FIGS. 3A-3E are schematic cross-sectional views showing chip structures having a bump and a testing pad according to a third embodiment of the present invention. Wherever possible, the same reference numbers are used in the third embodiment to refer to the same or like parts.

Referring to FIGS. 3A-3E, the circuit layer 136 under the passivation layer 140 comprises two contacts 138, 139 and a metal line 137, wherein the metal line 137 connects the contacts 138, 139. The passivation layer 140 has openings 142 and 144 exposing the contacts 138, 139, respectively. The post-passivation scheme comprises a metal layer 150 formed over the passivation layer 140 and connecting with the contacts 138, 139. The metal layer 150 comprises at least a bump pad 152 and at least a testing pad 154, wherein the bump pad 152 and the testing pad 154 are electrically connected through the metal line 137. The distance s between the bump pad 152 and the testing pad 154 is smaller than 1 micron and preferably smaller than 300 microns. At least a bump 160 can be formed on the bump pad 152. A testing probe (not shown) can touch the test pad 154 for testing the chip structure 300. Therefore, the mishap that the solder metal 162 of the bump 160 is traumatized by the impetus of the testing probe can be avoided. Moreover, the testing pad 154 is positioned at the area under which there is no electronic device 112 at the semiconductor substrate 110, so the electronic devices 112 being damaged during the testing step and the wire-bonding step can be avoided.

Figure 3A:
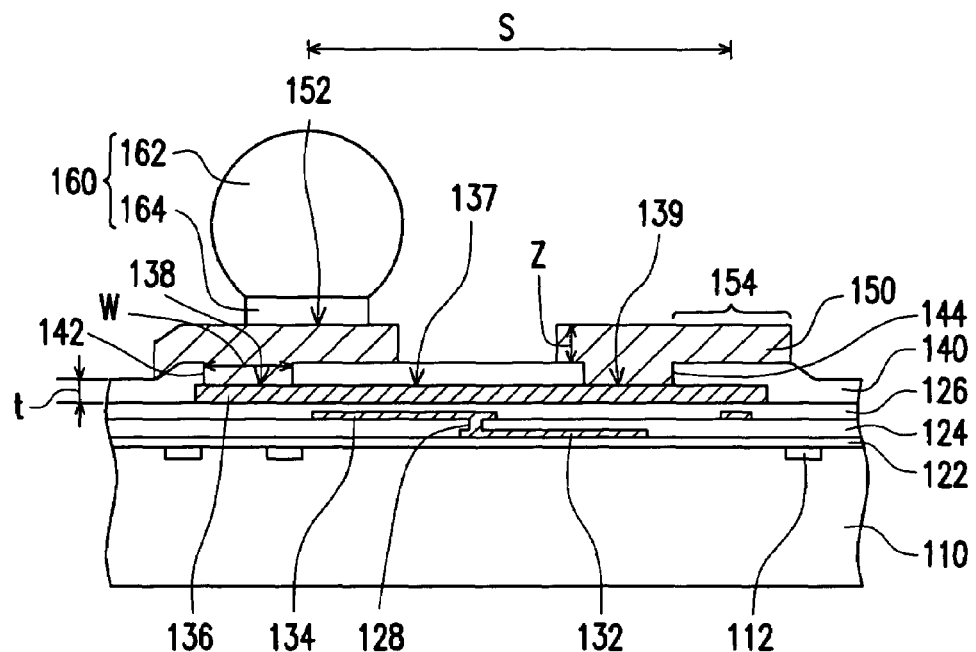
FIGS. 3A-3E are schematic cross-sectional views showing chip structures having a bump and a testing pad according to a third embodiment of the present invention. The main difference between FIG. 3 series and the rest figures lies on the metal scheme used for connecting a bump pad and a wire bonding pad. For FIG. 3, a metal line under the passivation layer is used to connect the bump pad and the wire-bonding pad.
Figure 3B:
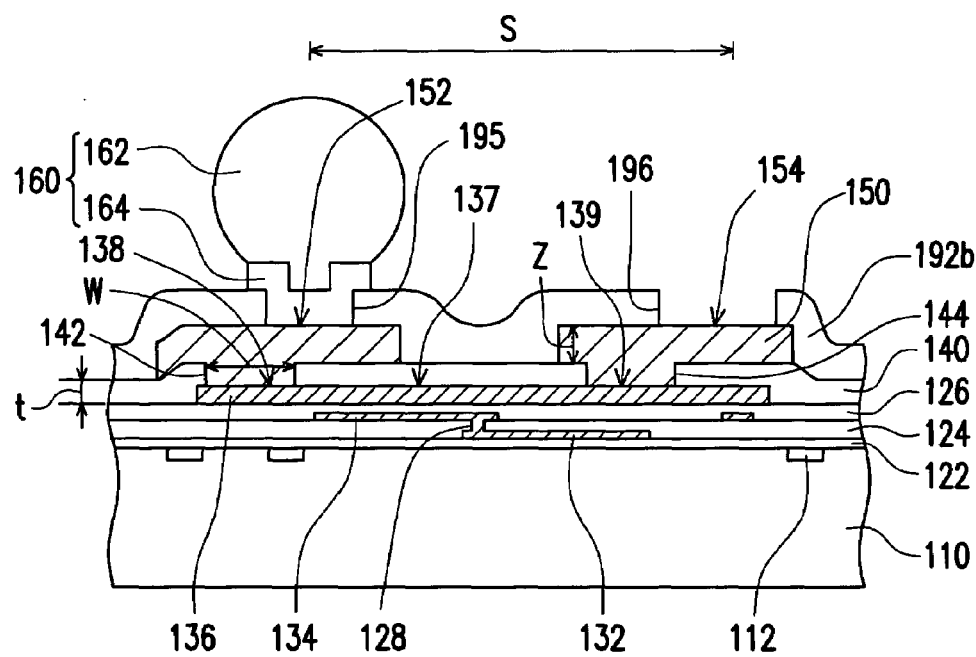
Figure 3C:
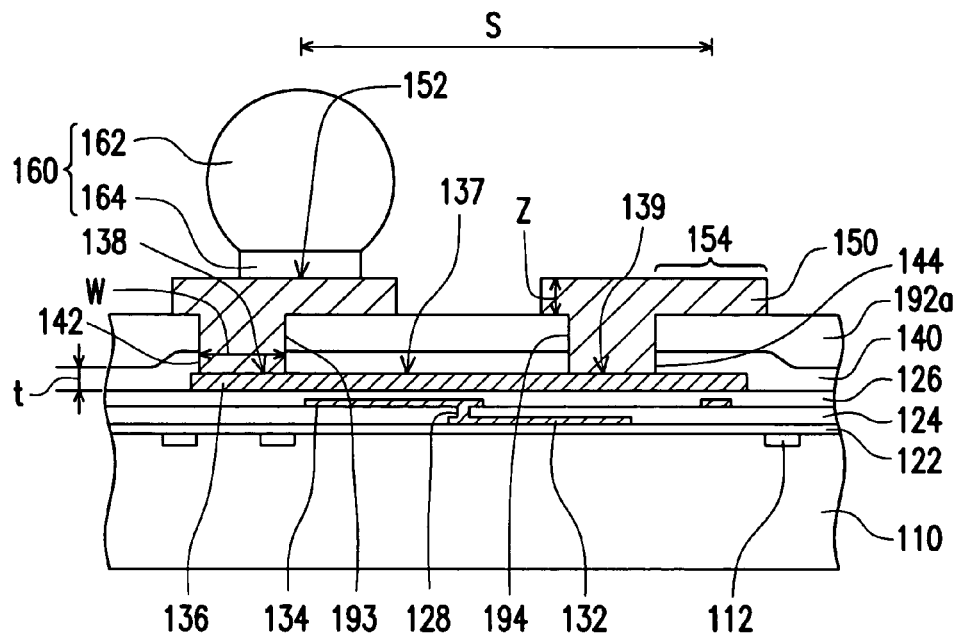
Figure 3D:
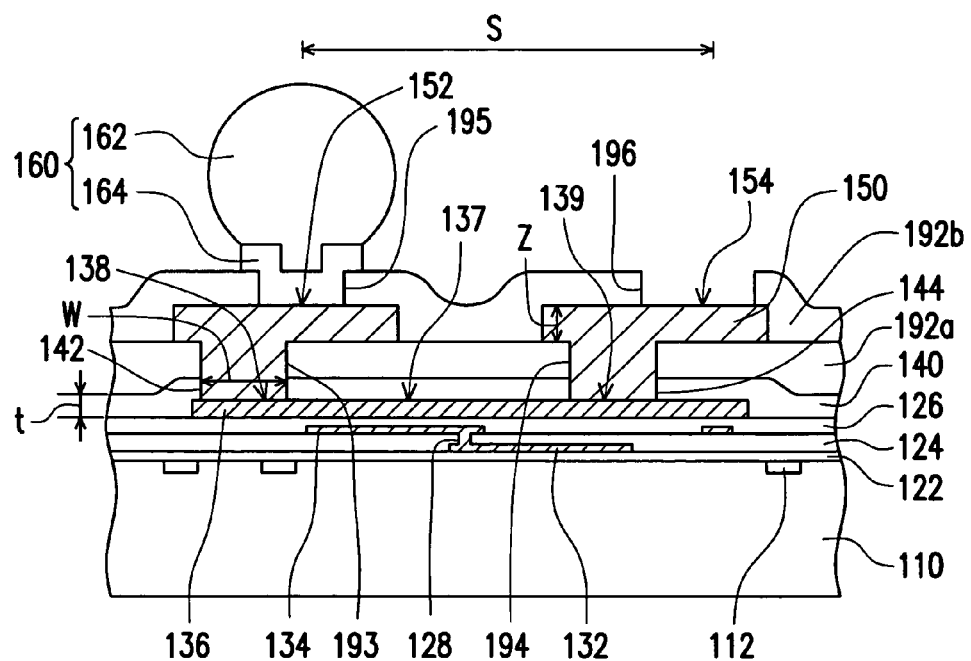
Figure 3E:
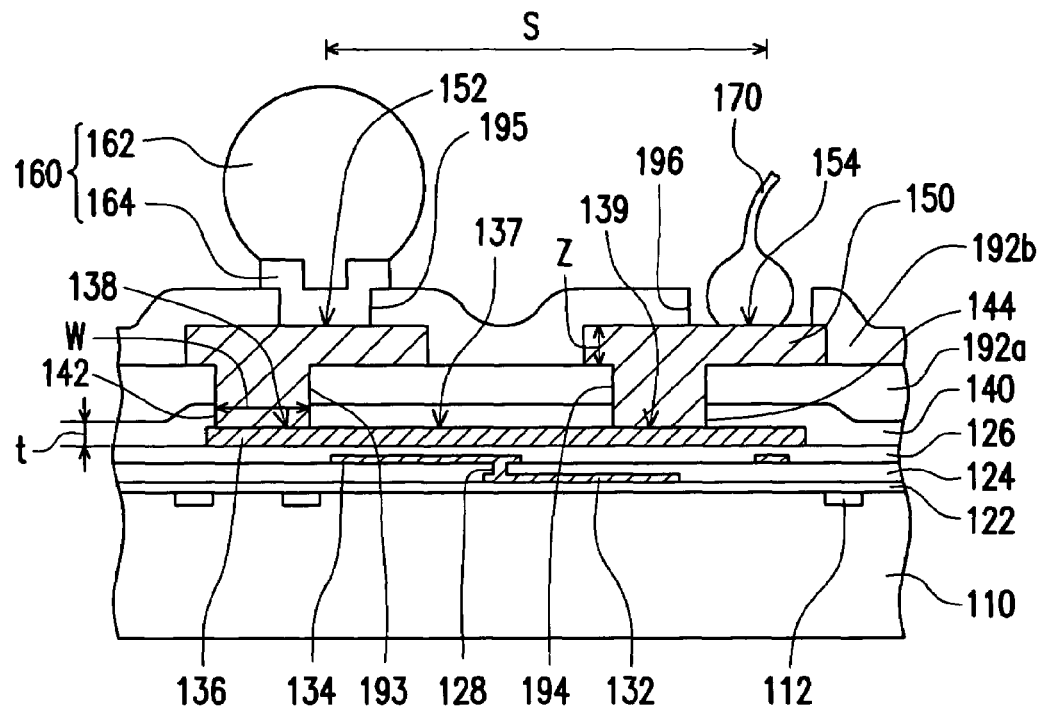

In a case, the metal layer 150 is directly formed on the passivation layer 140, as shown in FIGS. 3A and 3B. In another case, the metal layer 150 is not formed on the passivation layer 140 directly. In stead, the post-passivation scheme further comprises a polymer layer 192a formed between the metal layer 150 and the passivation layer 140, as shown in FIGS. 3C, 3D, and 3E. The polymer layer 192a has via holes 193 and 194 through which the metal layer 150 is connected to the contacts 138 and 139. Besides, the post-passivation scheme may comprise a polymer layer 192b formed on the metal layer 150 for preventing the metal layer 150 from being damaged by an external force and from being affected by the environment (i.e. moisture, particles, charges ... etc.), as shown in FIGS. 3B, 3D and 3E. The polymer layer 192b has openings 195 and 196 exposing the bump pad 152 and the testing pad 154, respectively. Alternatively, as shown in FIGS. 3A and 3C, all of the upper surface of the metal layer 150 can be exposed, under such a circumstance there is no polymer layer covering the upper surface of the metal layer 150. The polymer layers 192a and 192b can be made of, for example, polyimide, benzocyclobutene, porous dielectric material, parylene, epoxy, solder mask material or elastomer.

After the testing step, a wire-bonding step can be performed to form at least a conductive wire 170 connecting to the testing pad, as shown in FIG. 3E. Because the testing pad 154 is positioned on the area under which there is no electronic device 112 located at the semiconductor substrate 110, this structure has the efficacy of avoiding the electronic devices 112 from being damaged by the wire-bonding step. If the metal layer 150 comprises a gold layer for connecting the gold conductive wire 170, the bonding between the conductive wire 170 and the testing pad 154 is desirable.

Conclusion

The present invention has the following advantages:

1. During a testing step, a testing probe will contact the testing pad for testing the chip structure without contacting the bump. Therefore, the mishap that the solder metal of the bump is traumatized by the impetus of the testing probe can be avoided.

2. The testing pad can be positioned at the area under which there is no electronic device at the semiconductor substrate and thereby the electronic devices being damaged during testing can be avoided.

3. Since the metal layer comprises a gold layer for connecting the gold conductive wire, the bonding between the conductive wire and the testing pad is desirable.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

What is claimed is:

1. A chip comprising:
   a silicon substrate;
   a MOS device on a surface of said silicon substrate;
   a metallization structure over said silicon substrate, wherein said metallization structure comprises a first patterned circuit layer and a second patterned circuit layer over said first patterned circuit layer;
   a dielectric layer between said first and second patterned circuit layers;
   a passivation layer over said metallization structure, over said first and second patterned circuit layers and over said dielectric layer, wherein an opening in said passivation layer exposes a top surface of said metallization structure, wherein said passivation layer comprises a nitride layer and an oxide layer; and
   a third patterned circuit layer comprising a first portion connected to said top surface through said opening and used to have a metal bump formed thereover, a second portion used to be in contact with a testing probe, and a third portion used to be wirebonded thereto, wherein said first portion is connected to said second portion.

2. The chip of claim 1, wherein said second portion comprises a gold layer having a thickness of greater than 1 micron.

3. The chip of claim 1, wherein said third patterned circuit layer comprises a gold layer and a nickel layer under said gold layer.

4. The chip of claim 1, wherein said third patterned circuit layer comprises a gold layer and a copper layer under said gold layer.

5. The chip of claim 1, wherein said third patterned circuit layer comprises a copper layer, a nickel layer over said copper layer, and a gold layer over said nickel layer.

6. The chip of claim 1 further comprising a polymer layer between said passivation layer and said third patterned circuit layer.

7. The chip of claim 6, wherein said polymer layer comprises polyimide.

8. The chip of claim 1 further comprising a polymer layer on said patterned circuit layer, multiple openings in said polymer layer exposing said first, second and third portions.

9. The chip of claim 8, wherein said polymer layer comprises polyimide.

10. The chip of claim 1, wherein said third patterned circuit layer comprises a metal trace connecting said first and second portions.

11. The chip of claim 1, wherein said passivation layer has a thickness greater than 0.35 µm.

12. The chip of claim 1 further comprising said metal bump over said first portion.

13. The chip of claim 12 further comprising a nickel layer between said metal bump and said first portion.

14. The chip of claim 12, wherein said metal bump comprises solder.

15. The chip of claim 12 further comprising a copper layer between said metal bump and said first portion.

16. The chip of claim 12, wherein said metal bump comprises a lead-free solder.

17. The chip of claim 1, wherein said third patterned circuit layer comprises a metal trace connecting said second and third portions.

18. The chip of claim 1, wherein a pitch between said first and second portions is less than 300 µm.

19. The chip of claim 1, wherein a pitch between said first and second portions is less than 1 millimeter.

20. The chip of claim 1, wherein said second portion comprises a gold layer.

21. A chip comprising:
a silicon substrate;
a MOS device on a surface of said silicon substrate;
a metallization structure over said silicon substrate, wherein said metallization structure comprises a first patterned circuit layer and a second patterned circuit layer over said first patterned circuit layer;
a dielectric layer between said first and second patterned circuit layers;
a passivation layer over said metallization structure, wherein an opening in said passivation layer exposes a top surface of said metallization structure; and wherein said passivation layer comprises a nitride layer and an oxide layer; and
a third patterned circuit layer comprising a metal trace over said passivation layer and connected to said top surface through said opening, a first portion used to have a metal bump formed thereover and connected to said metal trace, and a second portion comprising a copper layer and a nickel layer over said copper layer of said second portion, wherein said copper and nickel layers of said second portion are used to be wirebonded thereover.

22. The chip of claim 21, wherein said second portion further comprises a titanium-containing layer under said copper layer.

23. The chip of claim 21, wherein said second portion further comprises a chromium-containing layer under said copper layer.

24. The chip of claim 21 further comprising a polymer layer between said passivation layer and said third patterned circuit layer.

25. The chip of claim 24, wherein said polymer layer comprises polyimide.

26. The chip of claim 21 further comprising a polymer layer on said third patterned circuit layer, multiple openings in said polymer layer exposing said first and second portions.

27. The chip of claim 26, wherein said polymer layer comprises polyimide.

28. The chip of claim 21, wherein said metal trace connects said first and second portions.

29. The chip of claim 21, wherein said third patterned circuit layer comprises a third portion used to be in contact with a testing probe.

30. The chip of claim 29, wherein said metal trace connects said first and third portions.

31. The chip of claim 21, wherein said passivation layer has a thickness greater than 0.35 µm.

32. The chip of claim 21 further comprising said metal bump over said first portion.

33. The chip of claim 32, wherein said metal bump comprises solder.

34. The chip of claim 32 further comprising an under-bump-metallurgy (UBM) layer between said metal bump and said first portion, wherein said under-bump-metallurgy (UBM) layer comprises nickel.

35. The chip of claim 32, wherein said metal bump comprises a lead-free solder.

36. The chip of claim 21 further comprising a wirebonded wire bonded over said second portion.

37. The chip of claim 21, wherein said second portion further comprises a gold layer over said nickel layer.

38. The chip of claim 21, wherein said metal trace comprises a copper layer.

39. The chip of claim 38, wherein said metal trace further comprises a nickel layer over said copper layer of said metal trace.

40. The chip of claim 39, wherein said metal trace further comprises a gold layer over said nickel layer of said metal trace.

41. The chip of claim 21, wherein said first portion comprises a copper layer.

42. The chip of claim 41, wherein said first portion further comprises a nickel layer over said copper layer of said first portion.

43. The chip of claim 42, wherein said first portion further comprises a gold layer over said nickel layer of said first portion.

* * * * *